US007577967B2

(12) United States Patent
Li et al.

(10) Patent No.: US 7,577,967 B2
(45) Date of Patent: Aug. 18, 2009

(54) FLEXIBLE PRINTED CIRCUIT FOR OPTICAL DISK DRIVE

(75) Inventors: Szu-Yun Li, Hsinchu (TW); Shih-Lin Yeh, Hsinchu (TW); Jui-Nan Chuang, Hsinchu (TW)

(73) Assignee: Lite-On It Corp., Taipei (TW)

( * ) Notice: Subject to any disclaimer, the term of this patent is extended or adjusted under 35 U.S.C. 154(b) by 486 days.

(21) Appl. No.: 10/915,404

(22) Filed: Aug. 11, 2004

(65) Prior Publication Data
US 2005/0183101 A1    Aug. 18, 2005

(30) Foreign Application Priority Data
Feb. 13, 2004    (TW) ............................... 93103555 A

(51) Int. Cl.
G11B 33/14    (2006.01)
H01B 7/08    (2006.01)
(52) U.S. Cl. ................. 720/650; 174/117 A; 174/117 F
(58) Field of Classification Search ................. 720/601, 720/652–653, 650; 174/254–259, 117 F, 174/117 A, 120 SC, 126.1; 360/245.9, 97.01, 360/264.2, 266.3, 264.3
See application file for complete search history.

(56) References Cited
U.S. PATENT DOCUMENTS

| | | | | |
|---|---|---|---|---|
| 5,003,126 A | * | 3/1991 | Fujii et al. | 174/117 F |
| 5,030,794 A | * | 7/1991 | Schell et al. | 174/117 F |
| 5,455,383 A | * | 10/1995 | Tanaka | 174/117 A |
| 6,487,048 B1 | * | 11/2002 | Dunn | 360/245.9 |
| 6,770,820 B2 | * | 8/2004 | Sakurai et al. | 174/117 F |
| 2001/0021085 A1 | * | 9/2001 | Satoh | 360/234.6 |
| 2001/0040043 A1 | * | 11/2001 | Ortiz et al. | 174/117 F |
| 2001/0048573 A1 | * | 12/2001 | Kawai et al. | 360/234.5 |
| 2002/0186508 A1 | * | 12/2002 | Kube et al. | 360/245.9 |

FOREIGN PATENT DOCUMENTS

JP    06309770 A    * 11/1994

OTHER PUBLICATIONS

Machine-Assisted Translation of JP 06-309770 with English abstract.*

* cited by examiner

*Primary Examiner*—Andrea L Wellington
*Assistant Examiner*—Nathan Danielsen
(74) *Attorney, Agent, or Firm*—Muncy, Geissler, Olds & Lowe, PLLC

(57) ABSTRACT

A flexible printed circuit for electrically connecting a disk tray to a chassis of an optical disk drive has a base layer, a copper layer, and a cover layer. The copper layer is attached to the base layer by a first adhesive layer, and has a plurality of separate electrical wires and a ground area. The cover layer has a cutout area corresponding to the ground area, and is attached to the copper layer by a second adhesive layer. A third adhesive layer is electrically conductive and used for attaching the cover layer to the chassis of the optical disk drive. Wherein the third adhesive layer is electrically connected to the ground area of the copper layer through the cutout area, the static charges accumulated on the copper layer will be discharged to the chassis.

4 Claims, 4 Drawing Sheets

FLEXIBLE PRINTED CIRCUIT FOR OPTICAL DISK DRIVE

BACKGROUND OF THE INVENTION

1. Field of the Invention

The present invention relates to an optical disk drive, and in particular to a flexible printed circuit that is more effective in discharging static charges that may be experienced by the optical disk drive.

2. Description of the Prior Art

Optical disk drives are becoming more popular in the market, and the optical disk drives are considered as standard equipment on personal computers for several years. Recently, slim-type optical disk drives are usually shipped with portable computer such as notebook, and the users can conveniently load and unload optical disks via the slim-type optical disk drives. In attempt to reduce the cost and adapt to the limited space constraint within notebooks, the conventional motor for disk loading and unloading operation has been eliminated. FIGS. 1-2 illustrate the conventional slim-type optical disk drive and its components. The conventional slim-type optical disk drive has a chassis 1, a disk tray 2, a playback unit 3, a front bezel 4 and a flexible printed circuit 5. The disk tray 2 and the playback unit 3 are positioned inside the chassis 1, and the playback unit 3 is positioned above the disk tray 2. When the user pushes an ejection button 41 defined in the front bezel 4, the disk tray 2 is ejected along the direction of arrow A as shown in FIGS. 1 and 2. Then, the user can place an optical disk on the playback unit 3 and then push the disk tray 2 back into the chassis 1 along the reverse direction of arrow A.

Referring to FIG. 2, the flexible printed circuit 5 has a first portion 51 and a second portion 52. A first connecting end 53 is integrally formed with the first portion 51, and a second connecting end 54 is integrally formed with the second portion 52. As shown in FIG. 2, the first connecting end 53 of the flexible printed circuit 5 can be electrically connected with the disk tray 2, and the second connecting end 54 can be electrically connected with the chassis 1. Besides, the second portion 52 of the flexible printed circuit 5 is attached to the chassis 1 by an adhesive layer 66 (as shown in FIG. 4). For simplicity, the first connecting end 53 is not connected with the disk tray 2.

FIG. 3 illustrates a plan view of the flexible printed circuit 5 in the prior art. As shown in FIG. 3, the flexible printed circuit 5 is generally U-shaped and has a plurality of separate electrical wires. The electrical wires are substantially parallel and are used to achieve electrical connection between the chassis 1 and the disk tray 2. As describe above, the first connecting end 53 of the flexible printed circuit 5 is electrically connected to the disk tray 2, and the second connecting end 54 of the flexible printed circuit 5 is electrically connected to the chassis 1.

FIG. 4 is a cross section of the flexible printed circuit 5 taken along line B-B of FIG. 3 and illustrates the combination of several layers. Referring to FIG. 4, the flexible printed circuit 5 has a multi-layers structure and includes a cover layer 61, a copper foil 63 and a base layer 65, and the flexible printed circuit 5 also has adhesive layers 62 and 64. Besides, the cover layer 61 and the base layer 65 are made of dielectric material (e.g. polyimide), and adhesive layers 62 and 64 are not electrically conductive. By the way, a finished single-layer structure bought from market usually consists of a copper foil 63, an adhesive layer 64 and a base layer 65. It is necessary for a single-layer structure to be a multi-layers structure by processing.

The second portion 52 of the flexible printed circuit 5 can be attached to the chassis 1 of the optical disk drive by the adhesive layers 66. When the user touches the optical disk drive, most of static charges usually flow to the optical disk drive and some of static charges may accumulate in the optical disk drive. As shown in FIG. 2, static charges can be discharged through an IDE bus 7 of the optical disk drive, and otherwise, excess electric charges flows through the chassis 1 and the disk tray 2, some components (e.g. optical pickup head) may be damaged, thereby rendering the optical disk drive unusable.

Thus, there is need to development for a flexible printed circuit for use in an optical disk device, and the flexible printed circuit is more effective in discharging static charges that may be experienced by the optical disk drive.

SUMMARY OF THE DISCLOSURE

It is an object of the present invention to provide a flexible printed circuit for use in an optical disk device.

It is another object of the present invention to provide a flexible printed circuit which is more effective in discharging static charges that may be experienced by the optical disk drive.

In order to accomplish the object of the present invention, the present invention provides a flexible printed circuit for use in the optical disk device. The flexible printed circuit includes a cover layer, a copper foil and a base layer. Besides, an adhesive layer is defined on the cover layer, and the flexible printed circuit is attached to the chassis of the optical disk drive by the adhesive layer. A part of copper foil uncovered by the cover layer and the adhesive layer is electrically conductive so that static charges flow through the chassis and host computer. Thus, there is no excess static charge accumulated in the optical disk drive.

BRIEF DESCRIPTION OF DRAWINGS

The present invention can be fully understood from the following detailed description and preferred embodiment with reference to the accompanying drawings in which.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Although the embodiments of the present invention are described below in connection with slim-type DVD-ROM drives, the present invention can be applied to all optical disk drive, including but not limited to CD-ROM drives, CD-RW drives, DVD-RAM drives, DVD-RW drives, DVD+RW drives, COMBO drives, car audio players, external drives, as well as all other optical media recorders and players.

Figure 1:
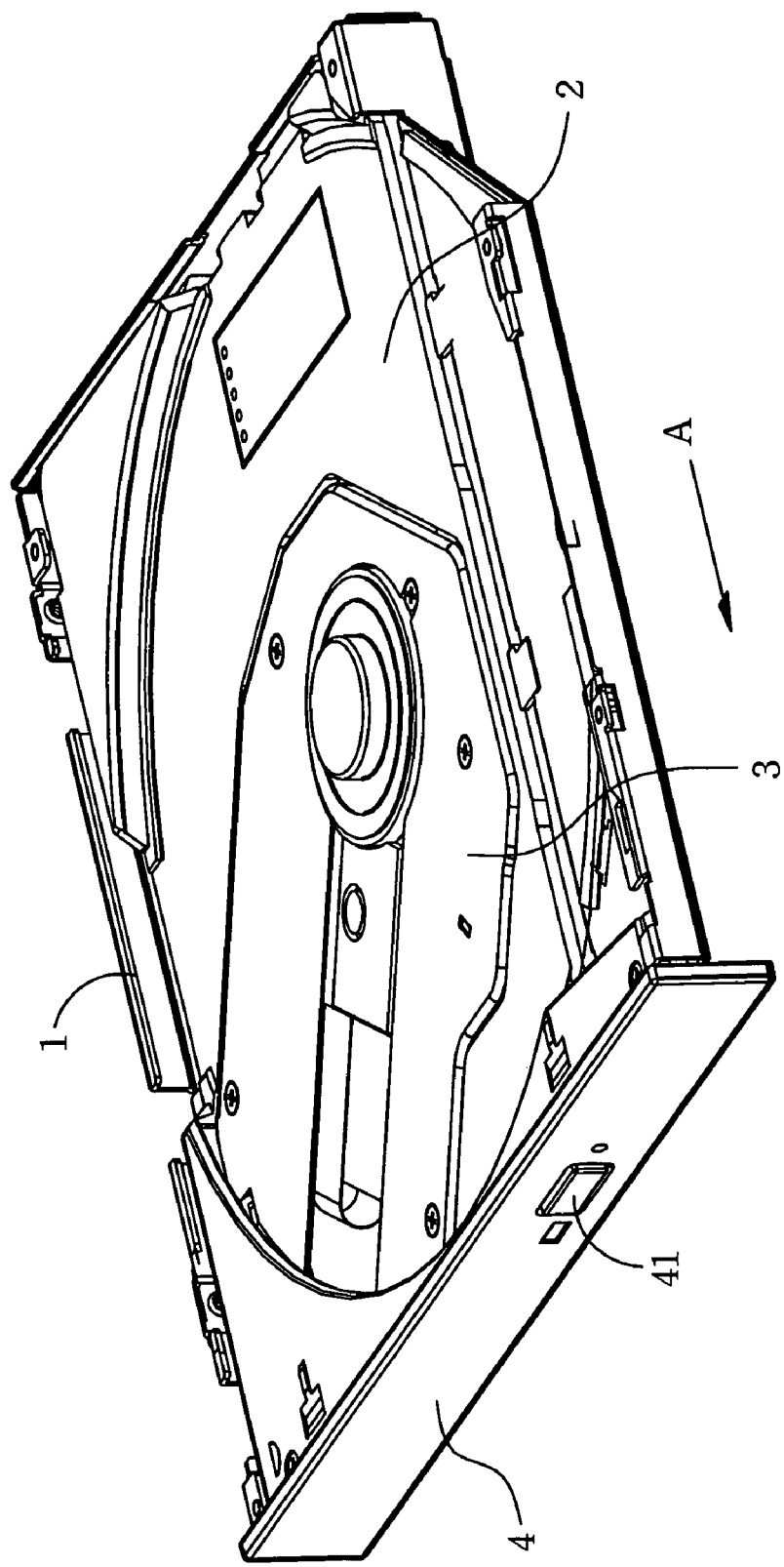
FIG. 1 is a perspective view of a conventional optical disk drive with a top cover removed.
Figure 2:
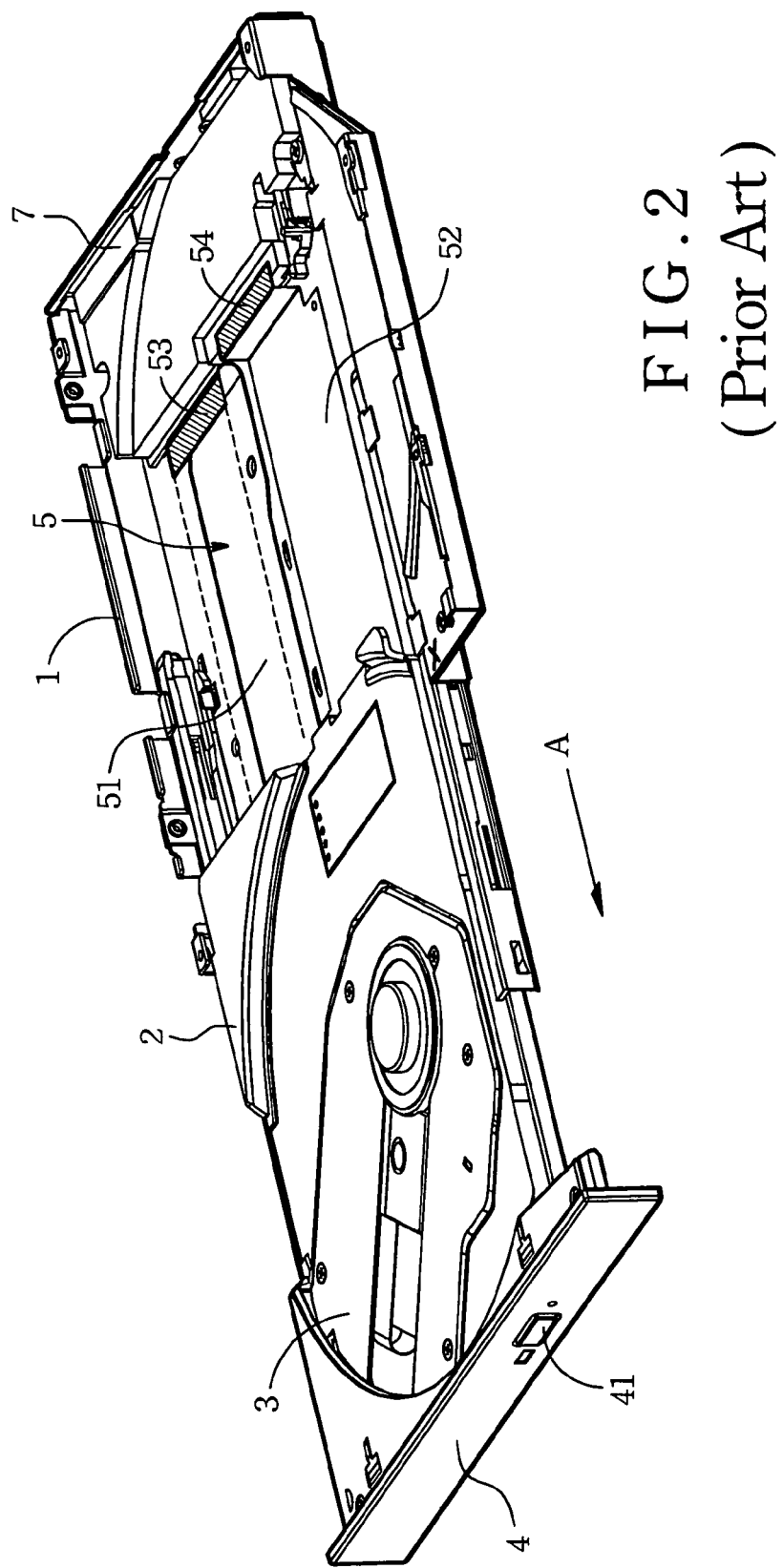
FIG. 2 is a perspective view of the conventional optical disk drive of FIG. 1 when a disk tray is pulled along the direction of an arrow A.
Figure 3:
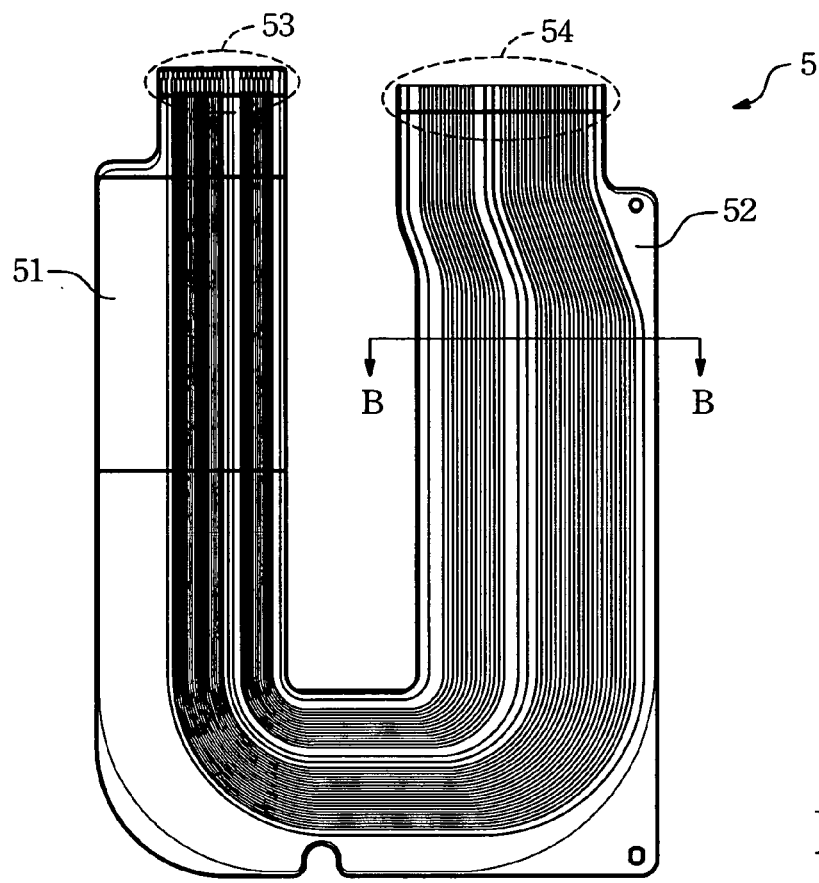
FIG. 3 is a plan view of the flexible printed circuit of conventional optical disk drive of FIG. 1.
Figure 4:
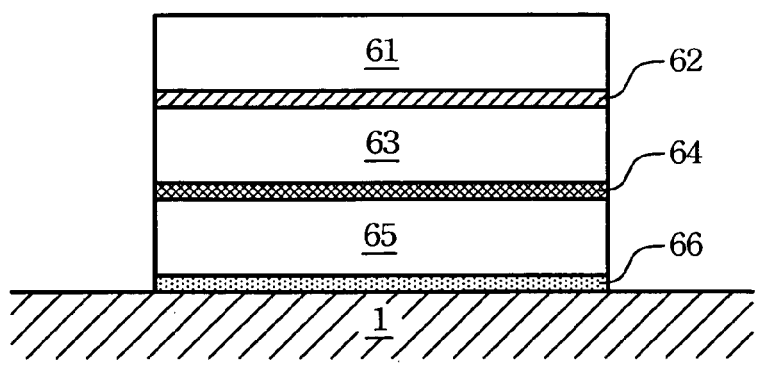
FIG. 4 is a cross-sectional view of the flexible printed circuit of the conventional optical disk drive taken along the line B-B of FIG. 3.
Figure 5:
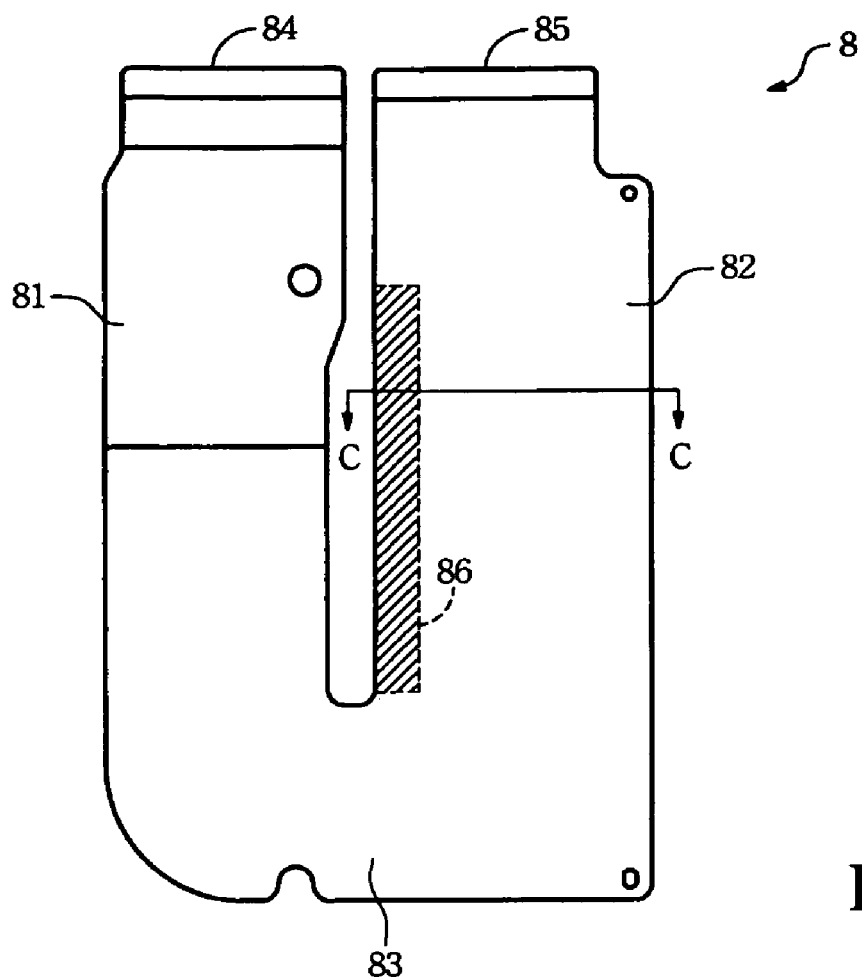
FIG. 5 is a plan view of the flexible printed circuit in accordance with the present invention.

The flexible printed circuit 8 of the invention is bought from market and processed reversely. Referring to FIG. 5, a flexible printed circuit 8 of the present invention is generally U-shaped and can be implemented in the conventional slim-type optical disk drive. The flexible printed circuit 8 in accordance with the present invention includes a first connecting portion 81 and a second connecting portion 82 and a central portion 83. A first connecting end 84 is integrally formed with the first connecting portion 81 of the flexible printed circuit 8 and electrically connected to the disk tray 2. Likely, a second connecting end 85 is integrally formed with the second connecting portion 82 of the flexible printed circuit 8 and electrically connected to the chassis 1.

Figure 6:
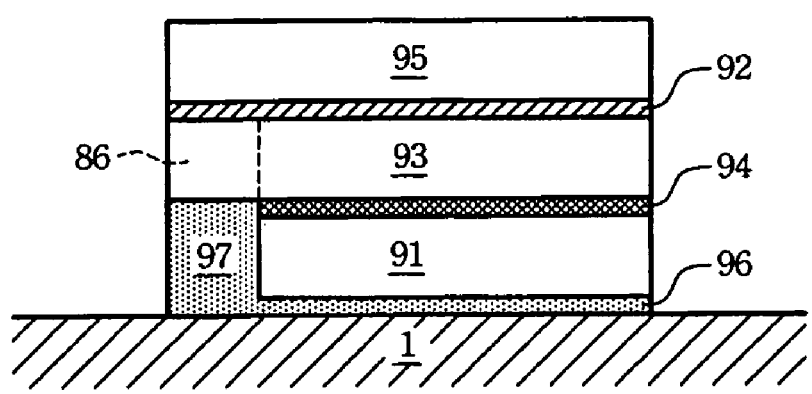
FIG. 6 is a cross-sectional view of the flexible printed circuit in accordance with the present invention taken along the line C-C of FIG. 5.

FIG. 6 illustrates a cross-sectional view of the flexible printed circuit of in accordance with the present invention taken along the line C-C in FIG. 5. Referring to FIGS. 5 and 6, the flexible printed circuit in accordance has a multi-layers structure and includes a cover layer 91, a copper layer 93 and a base layer 95. The multi-layers structure of the flexible printed circuit also has three adhesive layers 92, 94 and 96. The cover layer 91 and the base layer 95 are made of dielectric material (e.g. polyimide) and are not electrically conductive. The first adhesives layer 92 and the second adhesive layer 94 are also not electrically conductive. But the third adhesive layer 96 is made of conductive adhesive and are electrically conductive. In addition, the third adhesive layer 96 includes a protrusion 97. The protrusion 97 has the same properties as that of the third adhesive layer 96 described above.

Further referring to FIGS. 5 and 6, the copper layer 93 of the flexible printed circuit includes a plurality of separate electrical wires. Besides, a ground area 86 is indicated by a phantom line and defined on the copper layer 93 and the base layer 95 of the flexible printed circuit. During the manufacturing process of the flexible printed circuit, the ground area 86 is protected from being etched so that copper foil of the ground area 86 is exposed. The copper layer 93 is attached to the base layer 95 by the first adhesive layer 92, and the second adhesive layer 94 is applied to the copper layer 93 except the ground area 86. The cover layer 91 includes a cutout area that is similar to the ground area 86 of the copper layer 93. Then, the cover layer 91 is attached to the surface of the copper layer 93 by the second adhesive layer 94. The second connecting portion 82 of the flexible printed circuit is attached to the chassis 1 of the optical disk drive by the third adhesive layer 96 and the protrusion 97. In this regard, the ground area 86 of the copper layer 93 is electrically connected with the chassis 1 of the optical disk drive because the third adhesive layer 96 and the protrusion 97 electrically conductive, and the protrusion 97 passes through the cutout area connecting with the ground area 86.

Referring to FIG. 6, when static charges is generated by an ESD gun and put on the top surface of the second connecting portion 82 of the flexible printed circuit, the static charges will be discharged to the host in a more efficient way. Because the ground area 86 of the copper layer 93 is electrically conductive with the third adhesive layer 96 and the chassis 1, the static charges will be discharged to host through the chassis 1. Besides, the static charges can be discharged through an IDE bus 7 of the optical disk drive.

Thus, the optical disk drive with the flexible printed circuit in accordance with the present invention does not experience excess static charges which can have adverse impact on every electric components of the optical disk drive. Furthermore, the dischargeable flexible printed circuit of the invention is made from a finished single-layer structure bought from market processed reversely. However, for a manufacturing method for a flexible printed circuit having dischargeable function as the invention without reverse process, processes are necessary for every component of a single layer structure. For example, etching process for forming a plurality of separate electrical wires on a copper layer, drilling processing for drilling a plurality of holes openings on a base layer and gluing processing for gluing each component of the single layer structure. It is elaborate to buy and process those components individually. The reasons mentioned above cause high cost for producing and hard control for produced quality.

Based on previous discussions, it is clear that the advantages of the invention are not only can simplify dischargeable process of the flexible printed circuit, but also can reduce cost and improve quality of the flexible printed circuit.

While the invention has been described with reference to the preferred embodiments, the description is not intended to be construed in a limiting sense. It is therefore contemplated that the appended claims will cover any such modifications or embodiments as may fall within the scope of the invention defined by the following claims and their equivalents.

What is claimed is:

1. A U-shaped flexible printed circuit including a first connecting portion, a second connecting portion, and a central portion for electrically connecting a disk tray to a chassis of an optical disk drive, wherein a first connecting end is integrally formed with the first connecting portion for electrically connecting to the disk tray, and a second connecting end is integrally formed with the second connecting portion for electrically connecting to the chassis, comprising:
    a base layer;
    a copper layer attached to the base layer by a first adhesive layer, having a plurality of separate electrical wires and a ground area;
    a cover layer having a cutout area, wherein the copper layer is attached to the cover layer by a second adhesive layer and the ground area corresponds to the cutout area; and
    a third adhesive layer for attaching the cover layer to the chassis of the optical disk drive, having a protrusion corresponding to the cutout area, wherein the third adhesive layer is electrically conductive and electrically connected to the ground area of the copper layer through the cutout area by the protrusion, wherein the second connecting portion of the flexible printed circuit is attached to the chassis by the third adhesive layer.

2. The flexible printed circuit of claim 1, wherein the cover layer and the base layer are made of dielectric material and are not electrically conductive.

3. The flexible printed circuit of claim 1, wherein the optical disk drive is slim-type DVD-ROM.

4. The flexible printed circuit of claim 1, wherein the separate electrical wires are formed on a copper foil by etching, the ground area is protected from being etched.

* * * * *